(12) United States Patent
Tan et al.

(10) Patent No.: US 7,486,154 B1
(45) Date of Patent: Feb. 3, 2009

(54) FLICKER NOISE DEGENERATION TECHNIQUE FOR VCO

(75) Inventors: Chun Geik Tan, Singapore (SG); Randy Tsang, Foster City, CA (US)

(73) Assignee: Marvell International Ltd. (BM)

( * ) Notice: Subject to any disclaimer, the term of this patent is extended or adjusted under 35 U.S.C. 154(b) by 105 days.

(21) Appl. No.: 11/590,073

(22) Filed: Oct. 30, 2006

Related U.S. Application Data

(60) Provisional application No. 60/755,953, filed on Jan. 3, 2006, provisional application No. 60/737,264, filed on Nov. 16, 2005, provisional application No. 60/737,266, filed on Nov. 16, 2005.

(51) Int. Cl.
*H03L 1/00* (2006.01)
(52) U.S. Cl. ............... 331/186; 331/36 C; 331/117 FE
(58) Field of Classification Search ............. 331/36 C, 331/185, 186, 117 FE
See application file for complete search history.

(56) References Cited

U.S. PATENT DOCUMENTS 6,377,129 B1 * 4/2002 Rhee et al. ............. 331/111
6,396,357 B1 * 5/2002 Sun et al. ............... 331/57

\* cited by examiner

*Primary Examiner*—Robert Pascal
*Assistant Examiner*—Levi Gannon
(74) *Attorney, Agent, or Firm*—Brinks Hofer Gilson & Lione

(57) ABSTRACT

An oscillating circuit having improved noise degeneration includes an oscillator and a noise degeneration circuit. The oscillator is adapted to provide a differential oscillating signal between first and second output terminals, and includes first and second transistors in communication with the first and second output terminals. The noise degeneration circuit includes cross-coupled capacitors and cross-coupled third and fourth transistors operated in a linear region. The noise degeneration circuit reduces the low frequency gm of the first and second transistors to lower the effect of flicker noise. At relatively high frequencies, the capacitors provide a virtual AC ground to the source terminals of the first and second transistors. The noise degeneration circuit receives a voltage signal from a biasing circuit adapted to track variations in electrical characteristics of the third and fourth transistors.

35 Claims, 8 Drawing Sheets

FLICKER NOISE DEGENERATION TECHNIQUE FOR VCO

CROSS-REFERENCES TO RELATED APPLICATIONS

The present application claims priority under 35 U.S.C. § 119(e) to the following U.S. Provisional applications, the contents of all of which are incorporated herein by reference in their entirety:

Application No. 60/755,953, entitled "Flicker Noise Degeneration Technique for VCO," filed on Jan. 3, 2006, commonly assigned;

Application No. 60/737,264, entitled "Self-Biased Low Noise High PSRR Constant Gm VCO," filed on Nov. 16, 2005, commonly assigned; and Application No. 60/737,266, entitled "T-Network Capbank," filed on Nov. 16, 2005, commonly assigned.

BACKGROUND OF THE INVENTION

The present invention relates generally to voltage-controlled oscillators (VCO), and more particularly to degeneration (reduction) of flicker noise in VCOs.

FIG. 1 is a simplified block/circuit diagram of a conventional VCO 100. As shown, VCO 100 includes a current source 115, an LC resonant circuit 120, and cross-coupled NMOS transistors 130 and 135. For VCO 100, the resonant frequency f is determined by the following equation:

$$f = \frac{1}{2\pi\sqrt{LC}}, \qquad (1)$$

where L and C are the inductance and capacitance of the resonant circuit 120, respectively. In some conventional systems, such as that shown in FIG. 1, the capacitance value C is varied by a control voltage signal $V_{ctrl}$. In other systems, a capacitor bank with a number of fixed capacitance values is utilized in conjunction with a varactor.

Electronic oscillators typically include MOS devices which introduce noise, such as flicker noise, into the high frequency circuits. Such noise causes a random phase variation in the output oscillation, commonly known as phase noise of the oscillator. Phase noise is of concern because it degrades the signal to noise ratio and the integrity of data transmission. It is known that flicker noise is predominant at DC and low frequencies, and diminishes at higher frequencies. On the other hand, as RF design continues to advance into deep submicron technologies, the adverse effect of phase noise becomes more severe. For example, in 0.35 um technology, the flicker noise corner frequency is usually in KHz range, whereas in a 90 nm technology, the flicker noise corner frequency can be as high as MHz range. Thus, it would be desirable to provide improved methods and systems for flicker noise degeneration in a voltage controlled oscillators.

BRIEF SUMMARY OF THE INVENTION

In accordance with one embodiment of the present invention, an oscillating circuit has a noise degeneration circuit configured to reduce the flicker noise at low frequencies. At low frequencies, the noise degeneration circuit reduces the gm of a pair of transistors disposed in the oscillating circuit to lower the effect of flicker noise. At relatively high frequencies, one or more capacitor(s) disposed in the noise degeneration circuit provide a virtual AC ground to the source terminals of the transistor pair so as not to affect the gm of these transistors at high frequencies.

In an embodiment of the present invention, an oscillating circuit includes, in part, an oscillator and a noise degeneration circuit. The oscillator is adapted to provide a differential oscillating signal between first and second output terminals. The oscillator includes first and second transistors in communication with the first and second output terminals. The noise degeneration circuit includes, in part, a third transistor which has a first terminal in communication with one of the terminals of the first transistor and a second terminal in communication with a first voltage supply. The noise degeneration circuit also includes, in part, a fourth transistor which has a first terminal in communication with one of the terminals of the second transistor and a second terminal in communication with the first voltage supply. The noise degeneration circuit also includes, in part, first and second capacitors in communication with the first terminals of the third and fourth transistors.

The oscillating circuit of such embodiments includes, in part, a biasing circuit adapted to supply a voltage which tracks variations in electrical characteristics of the third and fourth transistors. In a specific embodiment, the third transistor is operated in a linear region, and the fourth transistor is operated in a linear region. In a particular embodiment, the first and second capacitors are cross-coupled between the first terminals of the third and fourth transistors to provide more symmetrical parasitic capacitance. In an embodiment the electrical characteristics include, in part, the transistor threshold voltage. In a specific embodiment, the electrical characteristics are defined by oxide thickness or channel length of the third and fourth transistors. In an embodiment, the biasing circuit further includes, in part, one or more diode-connected transistors, and a current source supplying a substantially stable first current to the one or more diode-connected transistors. In the biasing circuit of such embodiments, a drain terminal of the one or more diode-connected transistors supplies a voltage to the gate terminals of the third and fourth transistors and maintains the third and fourth transistors in the linear region.

In an oscillating circuit of such embodiments, the first and second transistors are cross-coupled transistors. The oscillating circuit of such embodiments can also include, in part, a current source supplying a substantially stable second current to the oscillator. In an embodiment, the first and second currents are supplied in response to a same biasing voltage. In an embodiment, the oscillator generates an oscillating signal having a frequency that varies in response to a control voltage. In a specific embodiment, the first voltage supply is a ground potential.

In accordance with an alternative embodiment of the invention, a method for degenerating noise in an oscillating circuit includes, in part, providing a virtual ground to the first terminals of first and second transistors during a first frequency of operation, maintaining a third transistors in direct communication with the first transistor, and maintaining a fourth transistors in direct communication with the second transistor. In an embodiment, the method also includes, in part, reducing a transconductance of said first and second transistors during a second frequency of operation.

The method of degenerating noise in an oscillating circuit of such embodiments further include, in part, supplying a voltage tracking variations in electrical characteristics of the third and fourth transistors. In an embodiment, the method further includes, in part, maintaining the third transistor in a linear region and maintaining the fourth transistor in a linear region. In a specific embodiment, the providing of a virtual ground further includes cross-coupling a first and second capacitors between the first terminals of said first and second transistors. In an embodiment, the electrical characteristics include, in part, transistor threshold voltage. In a specific embodiment, the electrical characteristics are defined by oxide thickness or channel length of the third and fourth transistors. The method further includes, in part, supplying a substantially constant first current to one or more diode-connected transistors, and supplying a voltage generated across the one or more diode-connected transistors to the gate terminals of the third and fourth transistors.

In an embodiment, the method of degenerating noise in an oscillating circuit further includes, in part, cross-coupling the first and second transistors. In an embodiment, the method also includes, in part, supplying a substantially constant second current to the oscillation circuit. The method further includes, in part, supplying said first and second currents in response to a same biasing voltage. In an embodiment, the method further includes, in part, varying an oscillating signal of the oscillating circuit in response to a control voltage. In a specific embodiment, the first voltage supply is a ground potential. In an embodiment, the method of degenerating noise in an oscillating circuit further includes, in part, maintaining an on-resistance of the third transistor substantially constant; and maintaining an on-resistance of the fourth transistor substantially constant.

In accordance with an another embodiment of the invention, an oscillating circuit with flicker noise degeneration includes, in part, means for providing a virtual ground to the first terminals of first and second transistors during a first frequency of operation, means for maintaining a third transistors in a linear region and in direct communication with the first transistor, and means for maintaining a fourth transistors in a linear region and in direct communication with the second transistor. In an embodiment, the oscillating circuit also includes, in part, means for reducing a transconductance of the first and second transistors during a second frequency of operation.

The oscillating circuit with noise degeneration of such embodiments further includes, in part, means for supplying a voltage tracking variations in electrical characteristics of the third and fourth transistors. The oscillating circuit further includes, in part, means for maintaining the third transistor in a linear region. means for maintaining the fourth transistor in a linear region. In a specific embodiment, the means for providing the virtual ground further includes means for cross-coupling a first and second capacitors between the first terminals of said first and second transistors. In an embodiment, the electrical characteristics include transistor threshold voltage. In an embodiment, the electrical characteristics are defined by oxide thickness or channel length of the third and fourth transistors. The oscillating circuit further includes, in part, means for supplying a substantially constant first current to one or more diode-connected transistors, and means for supplying a voltage generated across the one or more diode-connected transistors to the gate terminals of the third and fourth transistors.

In an embodiment, the oscillating circuit with noise degeneration further includes, in part, means for supplying a substantially constant second current to the oscillation circuit. The oscillator circuit further includes, in part, means for supplying said first and second currents in response to a same biasing voltage. In an embodiment, the oscillator circuit further includes, in part, means for varying an oscillating signal of the oscillating circuit in response to a control voltage. In an embodiment, the first voltage supply is a ground potential. In an embodiment, the oscillating circuit with noise degeneration further includes, in part, means for maintaining an on-resistance of the third transistor substantially constant; and means for maintaining an on-resistance of the fourth transistor substantially constant.

As can be seen from the discussions above, according to embodiments of the invention, improved techniques for flicker noise degeneration in a VCO are provided. Many benefits are achieved by way of the present invention over conventional techniques. The invention provides a method and device for a flicker noise degeneration circuit having effective noise degeneration at DC and low frequencies and reduced sensitivity to process and temperature variations. Depending upon the embodiment, one or more of these benefits may be achieved in various applications.

DETAILED DESCRIPTION OF THE INVENTION

Figure 1:
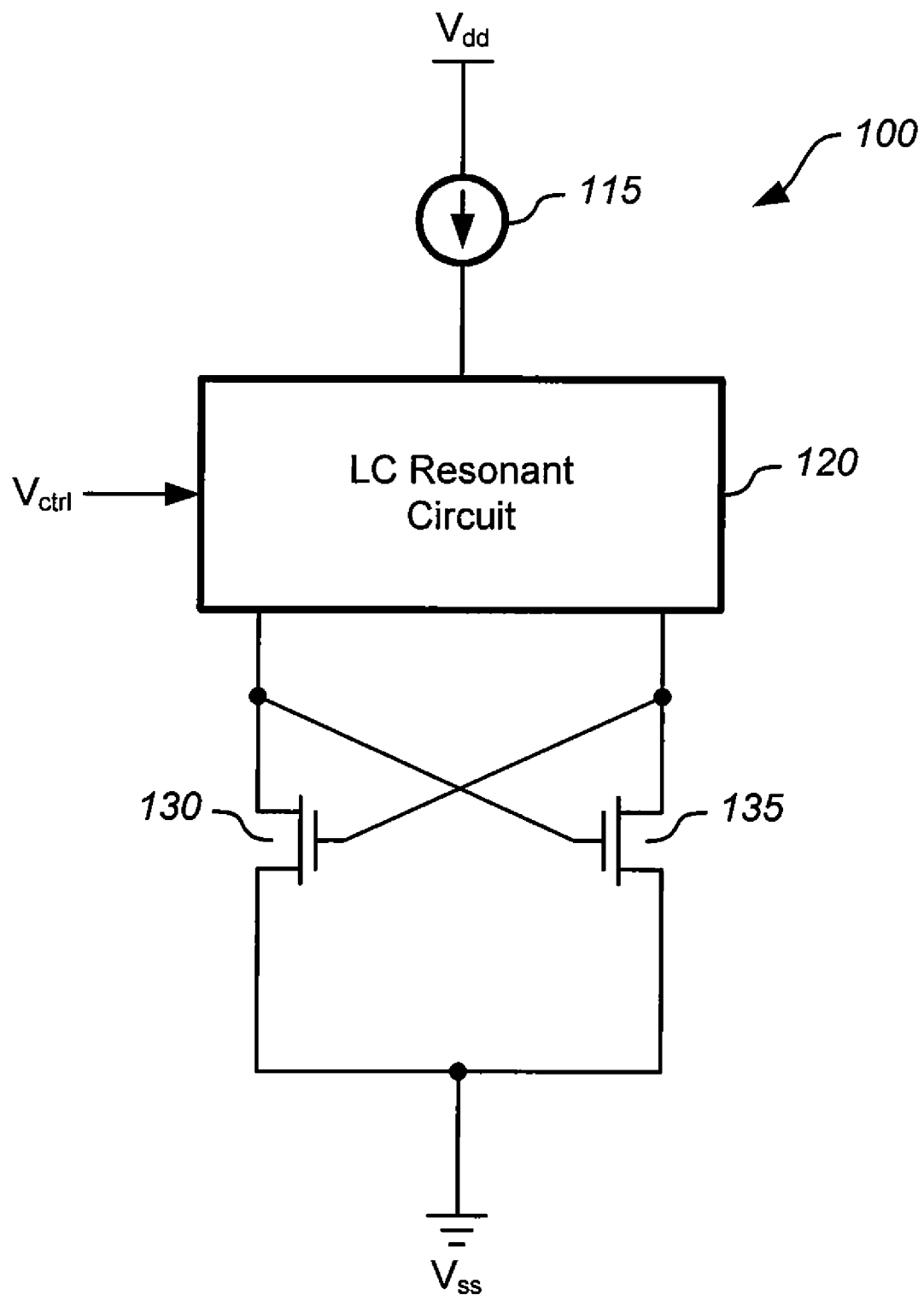
FIG. 1 is a simplified schematic diagram of a conventional VCO.
Figure 2:
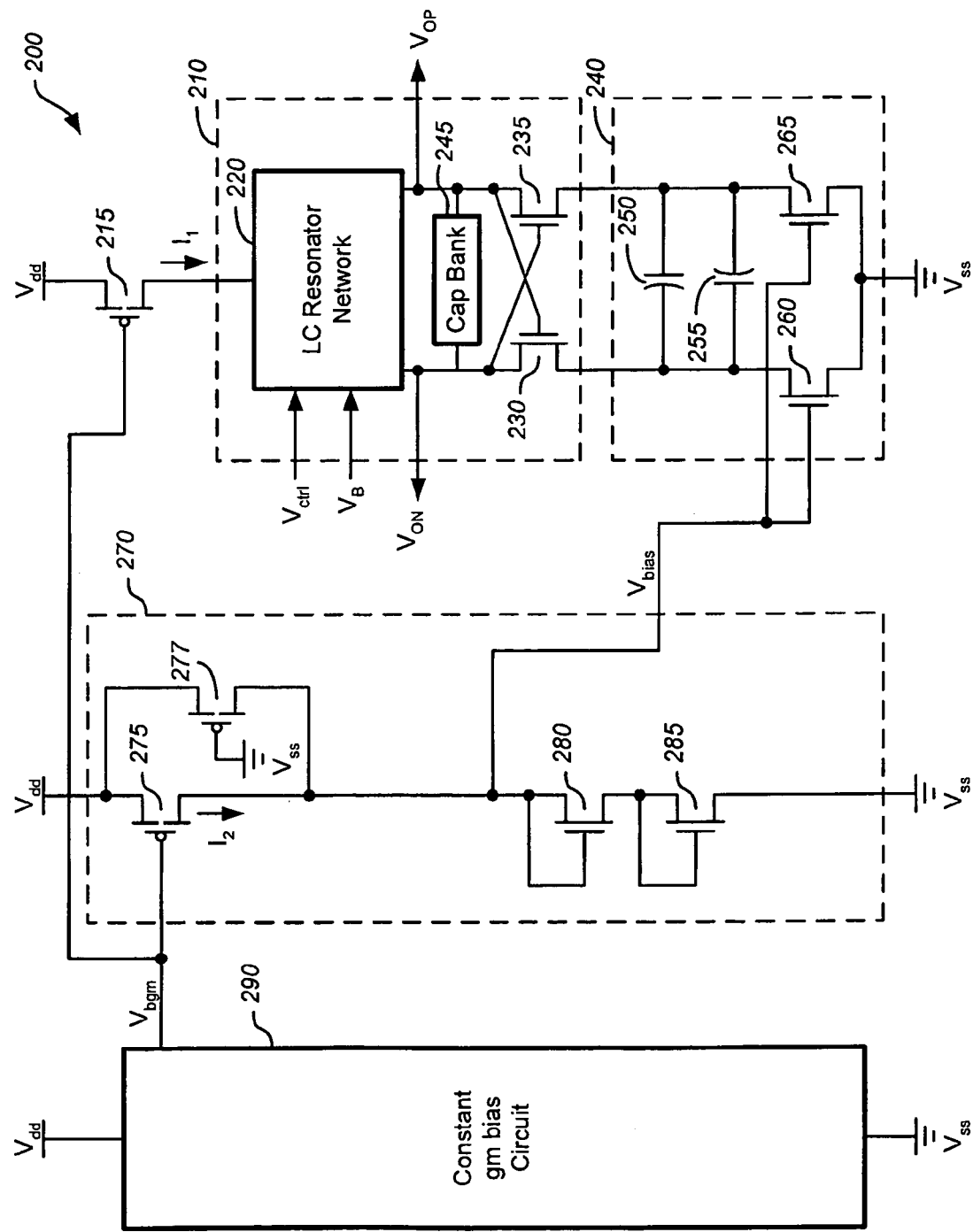
FIG. 2 is a simplified schematic diagram of a VCO including a flicker noise degeneration circuit according to an embodiment of the present invention.

FIG. 2 is a simplified schematic diagram of a voltage controlled oscillator (VCO) 200 according to an embodiment of the present invention. VCO 200 is shown as including, in part, an oscillator circuit 210, a flicker noise degeneration circuit 240, and bias circuit 270.

Oscillator circuit 210 includes, in part, an LC resonator network 220, a capacitor bank 245, and cross-coupled NMOS transistors 230 and 235. The current source formed using PMOS transistor 215 receives bias voltage $Y_{bgm}$ from constant-gm bias circuit 290, and delivers a current $I_1$ to the LC resonator network 220. LC resonator network 220 includes a varactor (not shown) whose capacitance is varied by a voltage control signal $V_{ctrl}$, and a multitude of inductors and capacitors (not shown). Bias voltage signal $V_B$ is used to bias oscillator circuit 210. By varying the control voltage signal $V_{ctrl}$, and $V_B$, the oscillation frequency of the VCO is changed. LC resonator network 220 generates a differential oscillating signal between output terminals $V_{ON}$ and $V_{OP}$. Capacitor bank 245 includes capacitors for coarse tuning of the frequency of signals $V_{ON}$ and $V_{OP}$.

As shown in FIG. 2, NMOS transistors 230 and 235 are cross-coupled, i.e., a drain terminal of each transistor is coupled to a gate terminal of the other transistor, and vice versa. The drain terminal of NMOS transistor 230 is also connected to one of the terminals of the LC resonator network 220. Similarly the drain terminal of NMOS transistor 235 is connected to the other terminal of the LC resonator network 220. Cross-coupled NMOS transistors 230 and 235 provide positive feedback to the LC resonator network 220 in order to sustain continued oscillation.

As discussed earlier, devices used in a VCO, for example, transistors 230 and 235, can introduce random variations in the oscillating frequency of the oscillator, also known as phase noise. In particular, flicker noise in a transistor can be modeled as a source of noise voltage signals injected into the gate terminal of the transistor. In oscillator circuit 210, flicker noise in transistors 230 and 235 may cause random frequency variations in the oscillating signals.

Flicker noise degeneration circuit 240 is adapted to degenerate flicker noise in VCO 200. As shown, flicker noise degeneration circuit 240 includes cross-coupled metal-insulator-metal (MIM) capacitors 250, 255, and NMOS transistors 260 and 265. Each capacitor will have some amount of bottom plate parasitic capacitance to ground. By having two of them connecting as shown in FIG. 2, the bottom plate parasitic capacitance seen by the NMOS cross coupled pair will be more symmetrical. A drain terminal of NMOS transistor 260 is connected to a source terminal of NMOS transistor 230, and to a common terminal of capacitors 250 and 255. Similarly a drain terminal of NMOS transistor 265 is connected to a source terminal of NMOS transistor 235, and to the other common terminal of capacitors 250 and 255. In the exemplary embodiment shown in FIG. 2, source terminals of NMOS transistors 260 and 265 are connected to ground terminal $V_{SS}$.

The capacitance values of capacitors 250 and 255 are selected such that in relatively high frequencies, e.g., 9 to 13 GHz, capacitors 250 and 255 provide a virtual AC ground to the source terminals of transistors 230, and 235. Accordingly, at such high frequencies, the transconductance (gm) of transistors 230 and 235 maintain substantially the same values they would otherwise have if the flicker noise degeneration circuit 240 was not used and the source terminals of transistors 230 and 235 were in direct communication with the virtual ground.

At low frequencies, for example from DC up to 200 MHz in some embodiments, the gm of transistors 230 and 235 is reduced (degenerated) by a factor defined in part, by the on resistance $r_{ds}$ of transistors 260 and 265, as well as by the impedances of capacitors 250 and 255. The reduction in the gm of these two transistors, in turn, causes a reduction in the up-conversion of the low frequency flicker noise into oscillator phase noise. Therefore, in accordance with one embodiment of the present invention, the gm of transistors 230 and 235 remains substantially unchanged at relatively high frequencies, but is decreased at relatively low frequencies to reduce the effect of flicker noise.

As described above, in flicker noise degeneration circuit 240, the on resistances of NMOS transistors 260 and 265 are utilized to reduce the low frequency gm of transistors 230 and 235. Therefore NMOS transistors 260 and 265 are biased in the triode region, or linear region of operation. As shown in FIG. 2, a bias voltage signal $V_{bias}$ is provided to the gate terminals of NMOS transistors 260 and 265 by a bias circuit 270, which includes a current source 275, PMOS transistor 277, and two NMOS transistors 280 and 285. The gate terminal of PMOS transistor 277 is connected to the ground terminal $V_{SS}$ and provides a relatively small current to transistors 280 and 285 during start-up of the circuit. Both transistors 280 and 285 are configured in a diode mode with their gate and drain terminals tied together, respectively. PMOS transistor 275 forms a current source which receives bias voltage signal $V_{bgm}$ from constant-gm bias circuit 290 and supplies a current $I_2$ to transistors 280 and 285. As can be seen in FIG. 2, the voltage bias signal $V_{bias}$ is the sum of the gate-to-source voltages $V_{gs}$ of diode-connected NMOS transistors 280 and 285. Voltage $V_{bias}$ is adapted such that it biases NMOS transistors 260 and 265 in the linear region.

Voltage $V_{bias}$ is adapted such that it tracks changes in the threshold voltages of transistors 260 and 265 caused by process and temperature variation. By utilizing constant-gm current, $I_2$, and diode drops of transistors 280 and 285, the on-resistances of 260 and 265 can be tracked by $V_{bias}$ throughout different process and temperature, therefore maintaining the flicker-noise degeneration and gm of transistors 230 and 235.

Figure 3:
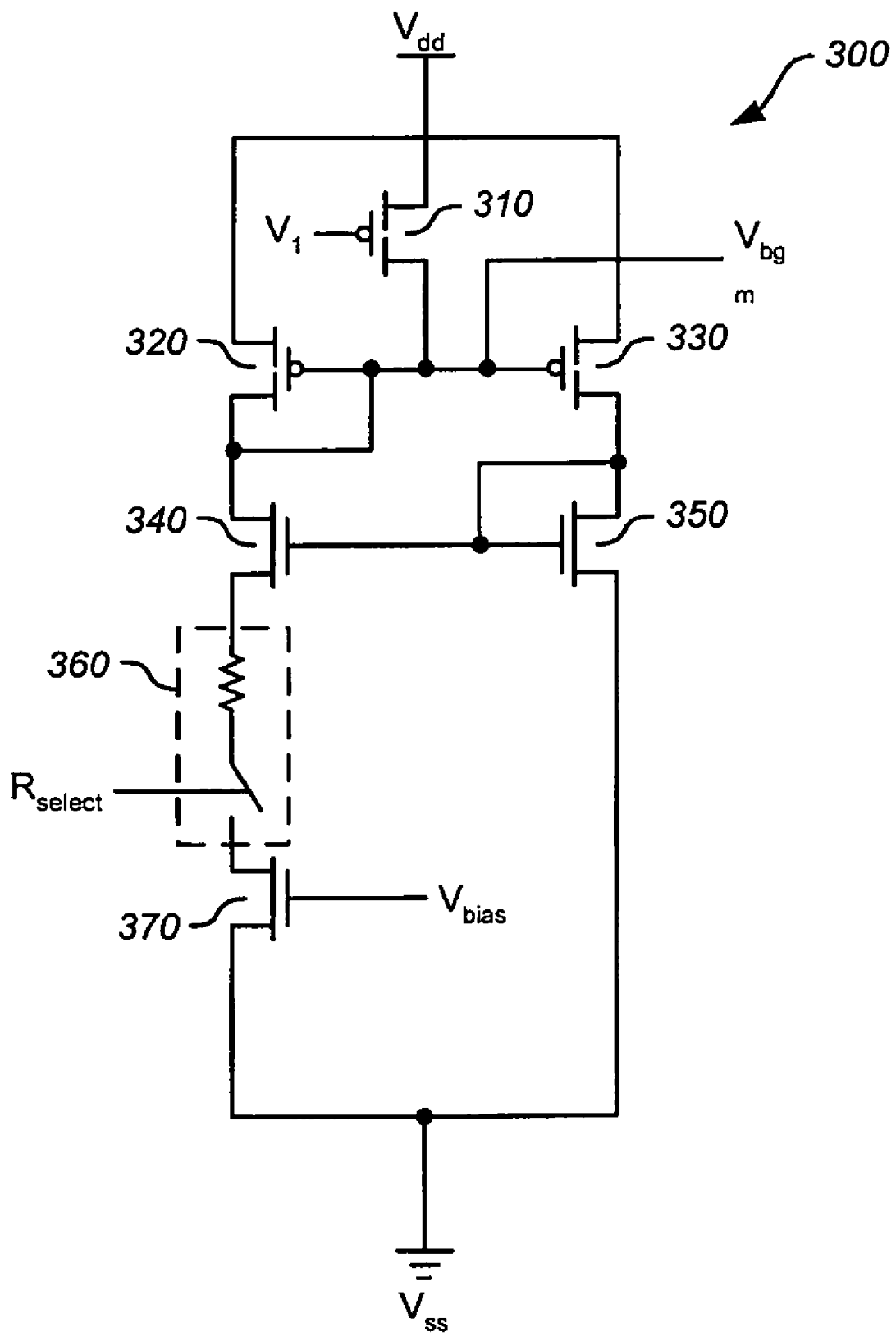
FIG. 3 is a simplified schematic diagram of a circuit used to bias the flicker noise degeneration circuit of FIG. 2.

Referring to FIG. 2, current source 275 of bias circuit 270 and current source 215 of the oscillator circuit 210 receive a gate bias $V_{bgm}$ from constant-gm bias circuit 290. As an example, FIG. 3 is a simplified schematic diagram of a constant-gm bias circuit 300 described in application No. 60/737,264, entitled "Self-Biased Low Noise High PSRR Constant Gm VCO," filed on Nov. 16, 2005, commonly assigned, the content of which is incorporated herein by reference in its entirety.

Figure 4:
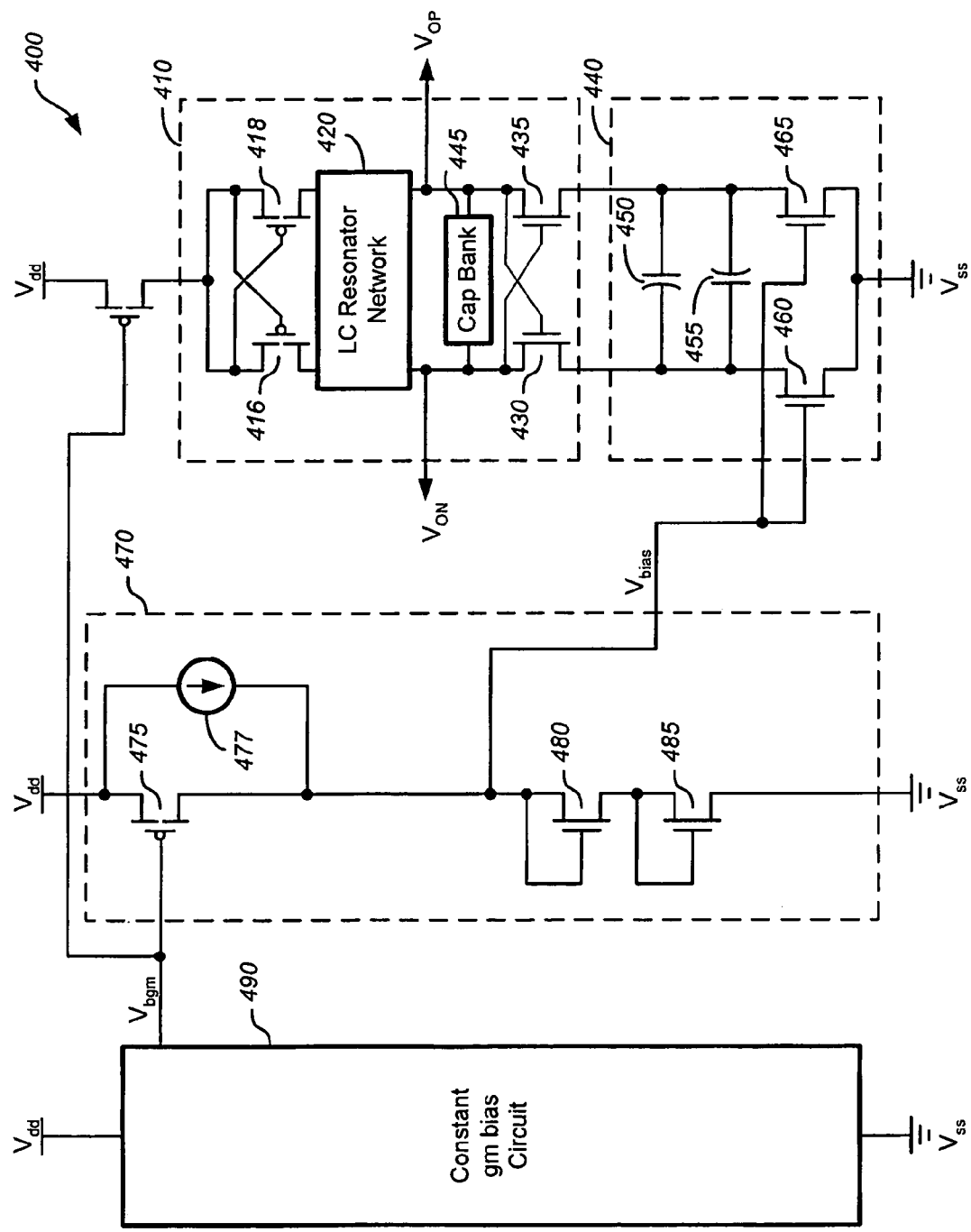
FIG. 4 is a simplified schematic diagram of a VCO including a flicker noise degeneration circuit according to an alternative embodiment of the present invention.

FIG. 4 is a schematic diagram of a complementary VCO 400 having disposed therein a flicker noise reduction circuit according to another embodiment of the invention. As seen, VCO 400 includes, among other components, a complementary oscillator circuit 410, flicker noise reduction circuit 440, bias circuit 470, and constant gm bias circuit 490. Oscillator circuit 410 is similar to oscillator 210 illustrated in FIG. 2, except that it further includes cross-coupled PMOS transistors 416 and 418 providing additional transconductance (gm) to the LC resonator network 420. Due to the reason that PMOS devices exhibit much lower flicker noise as compared to NMOS devices in general, flicker noise degeneration may be utilized only at the NMOS cross coupled pair. Flicker noise reduction circuit 440 operates in a manner similar to that described above with respect to flicker noise reduction circuit 240.

Merely by way of example, a VCO according to a specific embodiment of the invention can provide a target oscillation frequency range of about 9-13 GHz, operating under a voltage supply $V_{dd}$ of about 1.5 volts and a $V_{ctrl}$ range of about 0.5-1.0 volts. In other embodiments, these values can be changed. For example, in some applications $V_{ctrl}$ may be between 0.2 to 1.2 volts. In a specific embodiment of the invention, $V_{bias}$ can vary between 1.05 and 1.25 volts, keeping transistors 260 and 265 in a linear region of operation and compensating for process changes which may cause their on-resistance values to fluctuate. In a particular embodiment of the invention, capacitors 250 and 255 are MIM (Metal-Insulator-Metal) capacitors. In other applications, other types of capacitors can be used, for example, polysilicon-to-substrate capacitors. As an example, in a particular embodiment, the gm for NMOS transistors 230 and 235 are 50 mS. The on-resistances for NMOS transistors are 100 ohms each. The capacitances for capacitors 250 and 255 are 1 pF each. In this particular embodiment, the low frequency gm of VCO NMOS devices are degenerated by a factor of 6.

Figure 5A:
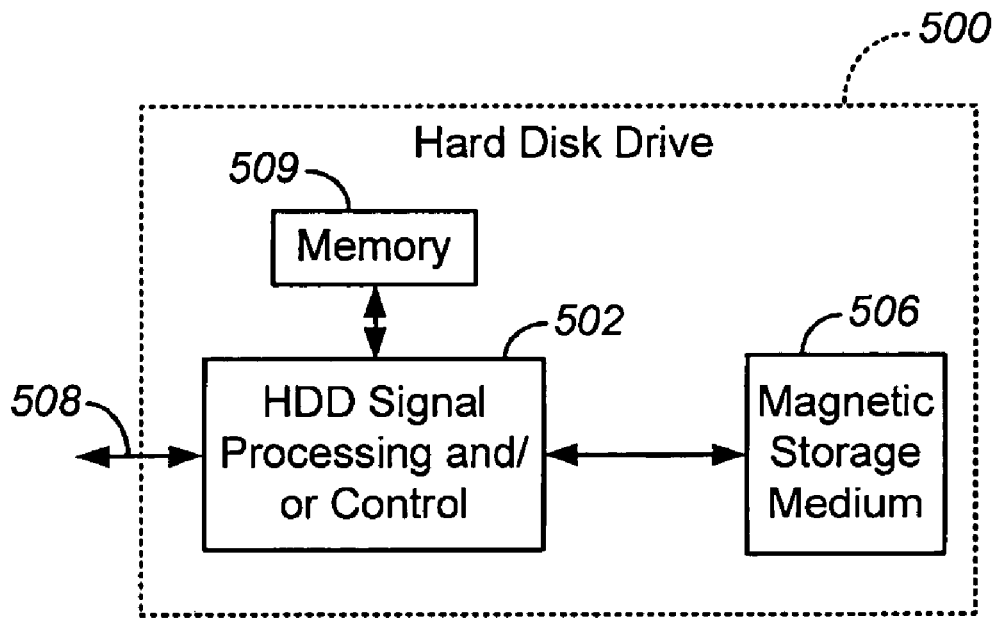
FIGS. 5A-5H show various devices in which the present invention may be embodied.

Referring now to FIGS. 5A-5H, various exemplary implementations of the present invention are shown. Referring to FIG. 5A, the present invention may be embodied in a hard disk drive 500. The present invention may implement either or both signal processing and/or control circuits, which are generally identified in FIG. 5A at 502. In some implementations, signal processing and/or control circuit 502 and/or other circuits (not shown) in HDD 500 may process data, perform coding and/or encryption, perform calculations, and/or format data that is output to and/or received from a magnetic storage medium 506.

HDD 500 may communicate with a host device (not shown) such as a computer, mobile computing devices such as personal digital assistants, cellular phones, media or MP3 players and the like, and/or other devices via one or more wired or wireless communication links 508. HDD 500 may be connected to memory 509, such as random access memory (RAM), a low latency nonvolatile memory such as flash memory, read only memory (ROM) and/or other suitable electronic data storage.

Figure 5B:
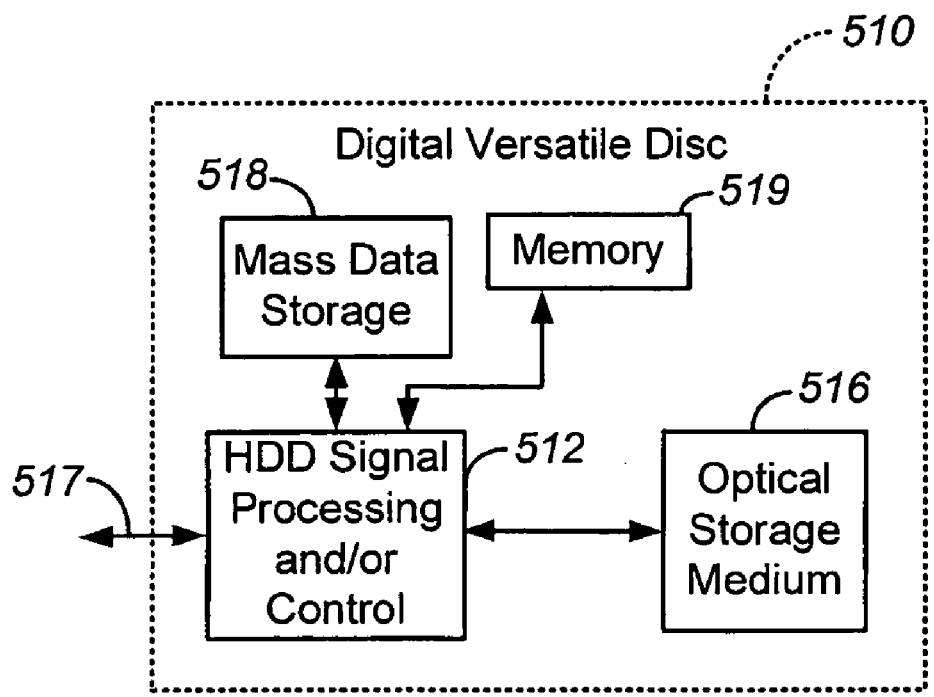

Referring now to FIG. 5B, the present invention may be embodied in a digital versatile disc (DVD) drive 55. The present invention may implement either or both signal processing and/or control circuits, which are generally identified in FIG. 5B at 512, and/or mass data storage 518 of DVD drive 510. Signal processing and/or control circuit 512 and/or other circuits (not shown) in DVD 510 may process data, perform coding and/or encryption, perform calculations, and/or format data that is read from and/or data written to an optical storage medium 516. In some implementations, signal processing and/or control circuit 512 and/or other circuits (not shown) in DVD 510 can also perform other functions such as encoding and/or decoding and/or any other signal processing functions associated with a DVD drive.

DVD drive 510 may communicate with an output device (not shown) such as a computer, television or other device via one or more wired or wireless communication links 517. DVD 510 may communicate with mass data storage 518 that stores data in a nonvolatile manner. Mass data storage 518 may include a hard disk drive (HDD) such as that shown in FIG. 5A. The HDD may be a mini HDD that includes one or more platters having a diameter that is smaller than approximately 1.8". DVD 510 may be connected to memory 519, such as RAM, ROM, low latency nonvolatile memory such as flash memory, and/or other suitable electronic data storage.

Figure 5C:
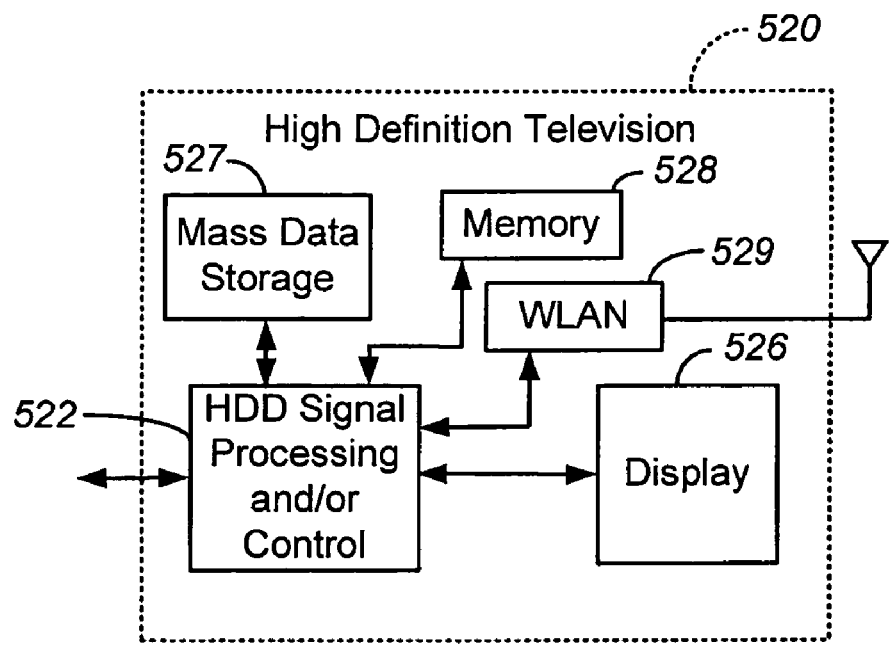

Referring now to FIG. 5C, the present invention may be embodied in a high definition television (HDTV) 520. The present invention may implement either or both signal processing and/or control circuits, which are generally identified in FIG. 5C at 522, a WLAN interface and/or mass data storage of the HDTV 520. HDTV 520 receives HDTV input signals in either a wired or wireless format and generates HDTV output signals for a display 526. In some implementations, signal processing circuit and/or control circuit 522 and/or other circuits (not shown) of HDTV 520 may process data, perform coding and/or encryption, perform calculations, format data and/or perform any other type of HDTV processing that may be required.

HDTV 520 may communicate with mass data storage 527 that stores data in a nonvolatile manner such as optical and/or magnetic storage devices. At least one HDD may have the configuration shown in FIG. 5A and/or at least one DVD may have the configuration shown in FIG. 5B. The HDD may be a mini HDD that includes one or more platters having a diameter that is smaller than approximately 1.8". HDTV 520 may be connected to memory 528 such as RAM, ROM, low latency nonvolatile memory such as flash memory and/or other suitable electronic data storage. HDTV 520 also may support connections with a WLAN via a WLAN network interface 529.

Figure 5D:
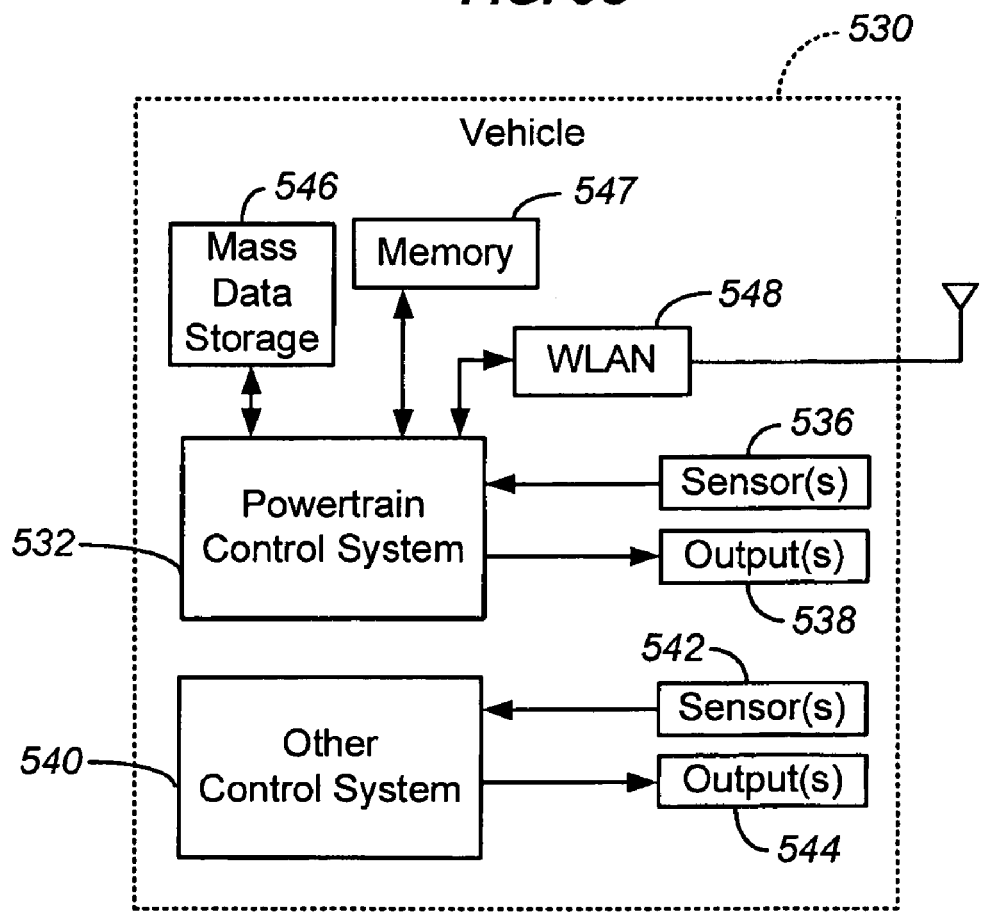

Referring now to FIG. 5D, the present invention implements a control system of a vehicle 530, a WLAN interface and/or mass data storage of the vehicle control system. In some implementations, the present invention implements a powertrain control system 532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 540 of vehicle 530. Control system 540 may likewise receive signals from input sensors 542 and/or output control signals to one or more output devices 544. In some implementations, control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 532 may communicate with mass data storage 546 that stores data in a nonvolatile manner. Mass data storage 546 may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Powertrain control system 532 may be connected to memory 547 such as RAM, ROM, low latency nonvolatile memory such as flash memory and/or other suitable electronic data storage. Powertrain control system 532 also may support connections with a WLAN via a WLAN network interface 548. The control system 540 may also include mass data storage, memory and/or a WLAN interface (all not shown).

Figure 5E:
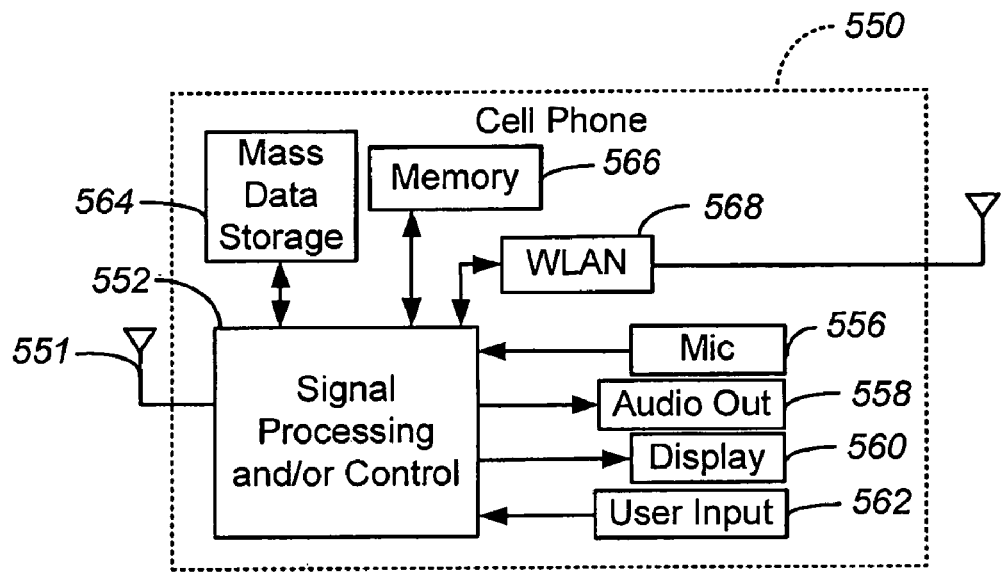

Referring now to FIG. 5E, the present invention may be embodied in a cellular phone 550 that may include a cellular antenna 551. The present invention may implement either or both signal processing and/or control circuits, which are generally identified in FIG. 5E at 552, a WLAN interface and/or mass data storage of the cellular phone 550. In some implementations, cellular phone 550 includes a microphone 556, an audio output 558 such as a speaker and/or audio output jack, a display 560 and/or an input device 562 such as a keypad, pointing device, voice actuation and/or other input device. Signal processing and/or control circuits 552 and/or other circuits (not shown) in cellular phone 550 may process data, perform coding and/or encryption, perform calculations, format data and/or perform other cellular phone functions.

Cellular phone 550 may communicate with mass data storage 564 that stores data in a nonvolatile manner such as optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Cellular phone 550 may be connected to memory 566 such as RAM, ROM, low latency nonvolatile memory such as flash memory and/or other suitable electronic data storage. Cellular phone 550 also may support connections with a WLAN via a WLAN network interface 568.

Figure 5F:
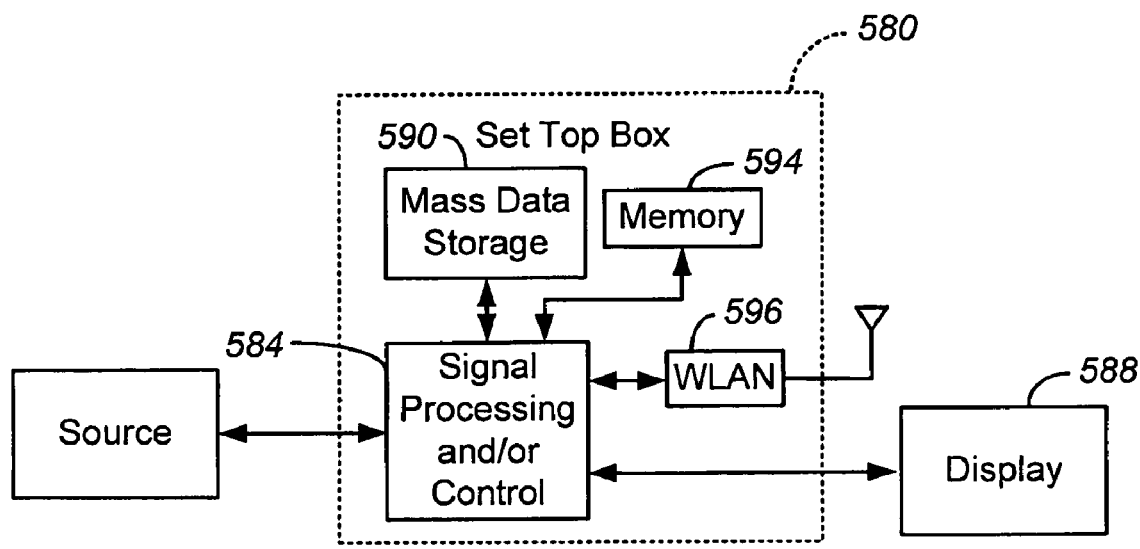

Referring now to FIG. 5F, the present invention may be embodied in a set top box 580. The present invention may implement either or both signal processing and/or control circuits, which are generally identified in FIG. 5F at 584, a WLAN interface and/or mass data storage of the set top box 580. Set top box 580 receives signals from a source such as a broadband source and outputs standard and/or high definition audio/video signals suitable for a display 588 such as a television and/or monitor and/or other video and/or audio output devices. Signal processing and/or control circuits 584 and/or other circuits (not shown) of the set top box 580 may process data, perform coding and/or encryption, perform calculations, format data and/or perform any other set top box function.

Set top box 580 may communicate with mass data storage 590 that stores data in a nonvolatile manner. Mass data storage 590 may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Set top box 580 may be connected to memory 594 such as RAM, ROM, low latency nonvolatile memory such as flash memory and/or other suitable electronic data storage. Set top box 580 also may support connections with a WLAN via a WLAN network interface 596.

Figure 5G:
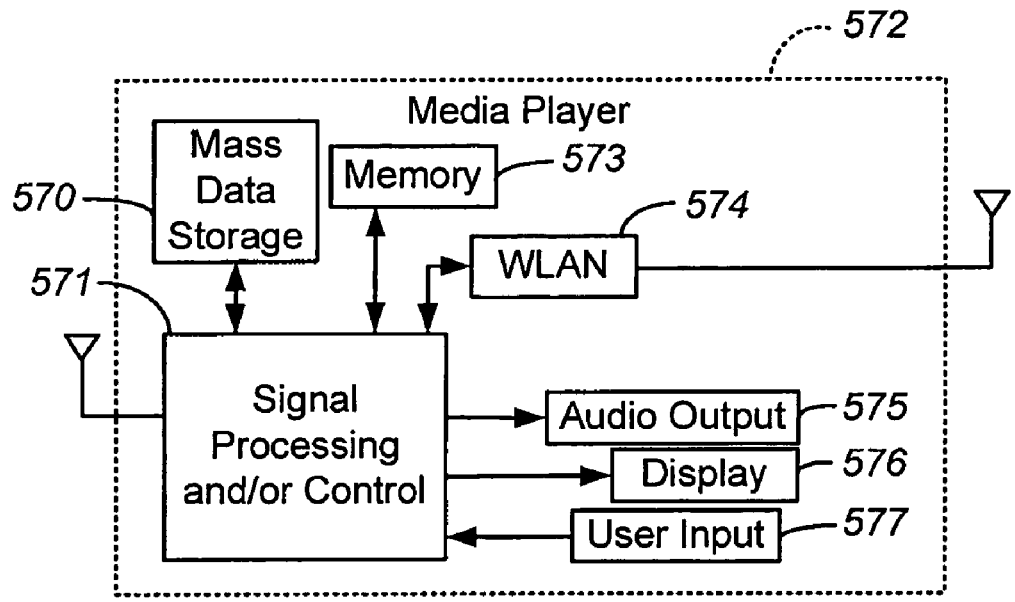

Referring now to FIG. 5G, the present invention may be embodied in a media player 572. The present invention may implement either or both signal processing and/or control circuits, which are generally identified in FIG. 5G at 571, a WLAN interface and/or mass data storage of the media player 572. In some implementations, media player 572 includes a display 576 and/or a user input 577 such as a keypad, touchpad and the like. In some implementations, media player 572 may employ a graphical user interface (GUI) that typically employs menus, drop down menus, icons and/or a point-and-click interface via display 576 and/or user input 577. Media player 572 further includes an audio output 575 such as a speaker and/or audio output jack. Signal processing and/or control circuits 571 and/or other circuits (not shown) of media player 572 may process data, perform coding and/or encryption, perform calculations, format data and/or perform any other media player function.

Media player 572 may communicate with mass data storage 570 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". Media player 572 may be connected to memory 573 such as RAM, ROM, low latency nonvolatile memory such as flash memory and/or other suitable electronic data storage. Media player 572 also may support connections with a WLAN via a WLAN network interface 574.

Figure 5H:
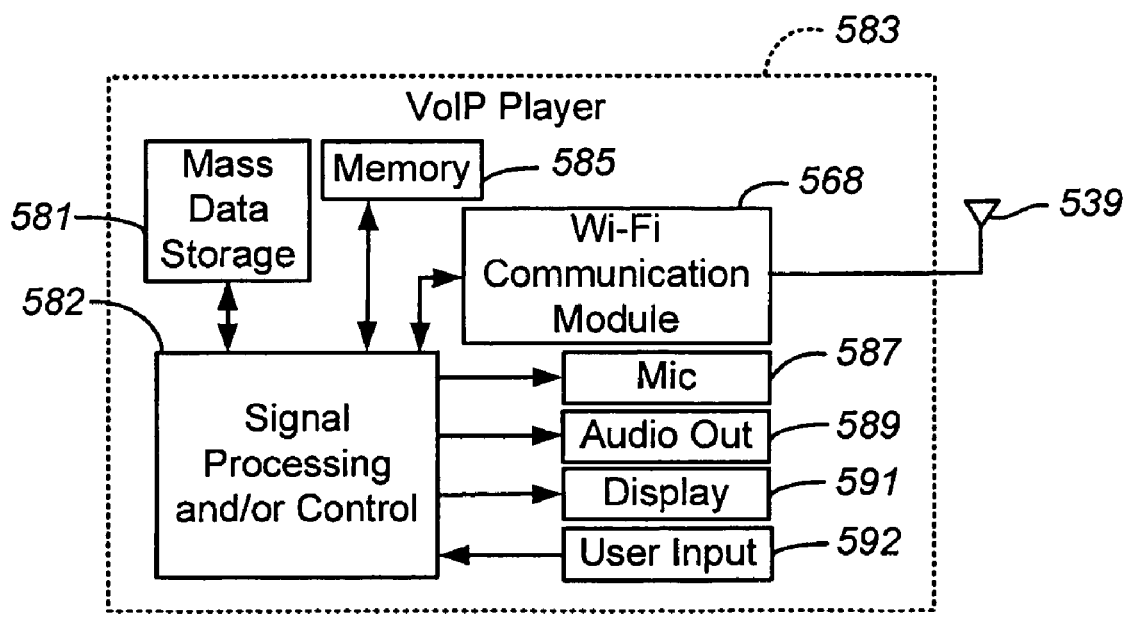

Referring to FIG. 5H, the present invention may be embodied in a Voice over Internet Protocol (VoIP) phone 583 that may include an antenna 539. The present invention may implement either or both signal processing and/or control circuits, which are generally identified in FIG. 5H at 582, a wireless interface and/or mass data storage of the VoIP phone 583. In some implementations, VoIP phone 583 includes, in part, a microphone 587, an audio output 589 such as a speaker and/or audio output jack, a display monitor 591, an input device 592 such as a keypad, pointing device, voice actuation and/or other input devices, and a Wireless Fidelity (Wi-Fi) communication module 586. Signal processing and/or control circuits 582 and/or other circuits (not shown) in VoIP phone 583 may process data, perform coding and/or encryption, perform calculations, format data and/or perform other VoIP phone functions.

VoIP phone 583 may communicate with mass data storage 502 that stores data in a nonvolatile manner such as optical and/or magnetic storage devices, for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". VoIP phone 583 may be connected to memory 585, which may be a RAM, ROM, low latency nonvolatile memory such as flash memory and/or other suitable electronic data storage. VoIP phone 583 is configured to establish communications link with a VoIP network (not shown) via Wi-Fi communication module 586. Still other implementations in addition to those described above are contemplated.

The above embodiments of the present invention are illustrative and not limitative. Various alternatives and equivalents are possible. The invention is not limited by the type of load devices, driver devices, or feedback configurations used. The invention is not limited by the type of integrated circuit in which the present disclosure may be disposed. Nor is the invention limited to any specific type of process technology, e.g. CMOS, Bipolar, or BICMOS that may be used to manufacture the present disclosure. Other additions, subtractions or modifications are obvious in view of the present disclosure and are intended to fall within the scope of the appended claims.

What is claimed is:

1. An oscillating circuit comprising:
   an oscillator to provide a differential oscillating signal between first and second output terminals, said oscillator comprising first and second transistors in communication with the first and second output terminals;
   a noise degeneration circuit comprising:
      a third transistor having a first terminal in communication with one of the terminals of the first transistor and a second terminal in communication with a first voltage supply;
      a fourth transistor having a first terminal in communication with one of the terminals of the second transistor and a second terminal in communication with the first voltage supply; and
      first and second capacitors in communication with the first terminals of the third and fourth transistors; and
   a biasing circuit to supply a voltage tracking variations in electrical characteristics of the third and fourth transistors, wherein the biasing circuit comprises:
   one or more diode-connected transistors; and
   a current source supplying a first current to the one or more diode-connected transistors, wherein a drain terminal of the one or more diode-connected transistors supplies a voltage to the gate terminals of the third and fourth transistors to maintain the third and fourth transistors in the linear region, and further to maintain their on-resistances substantially constant.

2. The oscillating circuit of claim 1 wherein said third transistor is operated in a linear region.

3. The oscillating circuit of claim 1 wherein said fourth transistor is operated in a linear region.

4. The oscillating circuit of claim 1 wherein said first and second capacitors are cross-coupled between the first terminals of said third and fourth transistors.

5. The oscillating circuit of claim 1 wherein said electrical characteristics include a transistor threshold voltage.

6. The oscillating circuit of claim 1 wherein said electrical characteristics are defined by oxide thickness or channel length of the third and fourth transistors.

7. The oscillating circuit of claim 1 wherein said first and second transistors are cross-coupled transistors.

8. The oscillating circuit of claim 1 further comprising:
a current source supplying a second current to the oscillator.

9. The oscillating circuit of claim 8 wherein said first and second currents are supplied in response to a common biasing voltage.

10. The oscillating circuit of claim 1 wherein said differential oscillating signal has a frequency that varies in response to a control voltage.

11. The oscillating circuit of claim 1 wherein said first voltage supply is a ground potential.

12. A method of degenerating noise in an oscillating circuit, the method comprising:
providing a virtual ground to first terminals of first and second transistors during a first frequency of operation;
maintaining a third transistor in direct communication with the first transistor;
maintaining a fourth transistor in direct communication with the second transistor;
reducing a transconductance of said first and second transistors during a second frequency of operation;
supplying a voltage tracking variations in electrical characteristics of the third and fourth transistors;
supplying a substantially constant first current to one or more diode-connected transistors; and
supplying a voltage generated across the one or more diode-connected transistors to the gate terminals of the third and fourth transistors.

13. The method of claim 12 further comprising maintaining said third transistor in a linear region.

14. The method of claim 12 further comprising maintaining said fourth transistor in a linear region.

15. The method of claim 12 wherein the providing of a virtual ground further comprising cross-coupling a first and second capacitors between the first terminals of said first and second transistors.

16. The method of claim 12 wherein said electrical characteristics include a transistor threshold voltage.

17. The method of claim 12 wherein said electrical characteristics are defined by oxide thickness or channel length of the third and fourth transistors.

18. The method of claim 12 further comprising cross-coupling said first and second transistors.

19. The method of claim 12 further comprising:
supplying a substantially constant second current to the oscillating circuit.

20. The method of claim 19 further comprising:
supplying said first and second currents in response to a common biasing voltage.

21. The method of claim 12 further comprising:
varying an oscillating signal of the oscillating circuit in response to a control voltage.

22. The method of claim 12 wherein said first voltage supply is a ground potential.

23. The method of claim 12, further comprising:
maintaining an on-resistance of the third transistor substantially constant;
and maintaining an on-resistance of the fourth transistor substantially constant.

24. An oscillating circuit comprising:
means for providing a virtual ground to first terminals of first and second transistors during a first frequency of operation;
means for maintaining a third transistor in direct communication with the first transistor;
means for maintaining a fourth transistor in direct communication with the second transistor;
means for reducing a transconductance of said first and second transistors during a second frequency of operation;
means for supplying a voltage tracking variations in electrical characteristics of the third and fourth transistors;
means for supplying a substantially constant first current to one or more diode-connected transistors; and
means for supplying a voltage generated across the one or more diode-connected transistors to the gate terminals of the third and fourth transistors.

25. The oscillating circuit of claim 24 further comprising means for maintaining said third transistor in a linear region.

26. The oscillating circuit of claim 24 further comprising means for maintaining said fourth transistor in a linear region.

27. The oscillating circuit of claim 24 wherein said means for providing the virtual-ground further comprising means for cross-coupling a first and second capacitors between the first terminals of said first and second transistors.

28. The oscillating circuit of claim 24 wherein said electrical characteristics includes a transistor threshold voltage.

29. The oscillating circuit of claim 24 wherein said electrical characteristics are defined by oxide thickness or channel length of the third and fourth transistors.

30. The oscillating circuit of claim 24 further comprising means for cross-coupling said first and second transistors.

31. The oscillating circuit of claim 24 further comprising:
means for supplying a substantially constant second current to the oscillating circuit.

32. The oscillating circuit of claim 31 further comprising:
means for supplying said first and second currents in response to a common biasing voltage.

33. The oscillating circuit of claim 24 further comprising:
means for varying an oscillating signal of the oscillating circuit in response to a control voltage.

34. The oscillating circuit of claim 24 wherein said first voltage supply is a ground potential.

35. The oscillating circuit of claim 24 further comprising:
means for maintaining an on-resistance of the third transistor substantially constant; and
means for maintaining an on-resistance of the fourth transistor substantially constant.

* * * * *